United States Patent
Meeker et al.

(10) Patent No.: US 9,347,972 B2
(45) Date of Patent: May 24, 2016

(54) ALTERNATE VOLTAGE SENSING METHOD FOR INCREASED WEATHER ROBUSTNESS OF UNGROUNDED POWER LINE SENSORS

(71) Applicant: Foster-Miller, Inc., Waltham, MA (US)

(72) Inventors: David C. Meeker, Natick, MA (US);
Brian M. Compter, Foxboro, MA (US)

(73) Assignee: Foster-Miller, Inc., Waltham, MA (US)

(*) Notice: Subject to any disclaimer, the term of this patent is extended or adjusted under 35 U.S.C. 154(b) by 0 days.

(21) Appl. No.: 14/621,696

(22) Filed: Feb. 13, 2015

(65) Prior Publication Data
US 2015/0285842 A1 Oct. 8, 2015

Related U.S. Application Data

(60) Provisional application No. 61/976,191, filed on Apr. 7, 2014.

(51) Int. Cl.
*G01R 15/14* (2006.01)
*G01R 35/00* (2006.01)

(52) U.S. Cl.
CPC ............ *G01R 15/144* (2013.01); *G01R 35/005* (2013.01)

(58) Field of Classification Search
CPC ..... G01R 15/12; G01R 15/144; G01R 35/005
USPC .......................... 324/762.08, 500, 76.77, 127
See application file for complete search history.

(56) References Cited

U.S. PATENT DOCUMENTS

| | | | |
|---|---|---|---|
| 4,689,752 A | 8/1987 | Fernandes et al. | |
| 4,795,973 A | 1/1989 | Smith-Vaniz et al. | |
| 5,565,783 A * | 10/1996 | Lau ....................... | G01R 15/142 324/127 |
| 6,677,743 B1 | 1/2004 | Coolidge et al. | |
| 2012/0139554 A1* | 6/2012 | Parsons .................. | G01R 35/04 324/543 |
| 2014/0125354 A1 | 5/2014 | Mason et al. | |

FOREIGN PATENT DOCUMENTS

| | | |
|---|---|---|
| EP | 0314850 B1 | 3/1994 |
| WO | 2004040322 A1 | 5/2004 |

OTHER PUBLICATIONS

Written Opinion of the International Searching Authority mailed Jun. 8, 2015 for International Application No. PCT/US2015/017721, 5 pages.

* cited by examiner

*Primary Examiner* — Christopher Mahoney
(74) *Attorney, Agent, or Firm* — Iandiorio Teska & Coleman, LLP

(57) ABSTRACT

A voltage sensing system and method for use with ungrounded power line sensors deployed on each phase of a power line. The voltage of each phase is measured using the sensors. This measurement is used unless there is a snow event. A collector is powered by a transformer connected to the power line being monitored and a voltage measurement circuit is configured to measure the collector supply voltage which is then used to obtain an alternate voltage measurement for each phase. When the sensor measured voltage for any phase deviates from the alternate voltage measurement by a pre-established value, a snow event has occurred and the alternate voltage measurement may then be used.

14 Claims, 10 Drawing Sheets

Setup Tool

ALTERNATE VOLTAGE SENSING METHOD FOR INCREASED WEATHER ROBUSTNESS OF UNGROUNDED POWER LINE SENSORS

RELATED APPLICATIONS

This application claims benefit of and priority to U.S. Provisional Application Ser. No. 61/976,191 filed Apr. 7, 2014 under 35 U.S.C. §§119, 120, 363, 365, and 37 C.F.R. §1.55 and §1.78 and incorporated herein by this reference.

FIELD OF THE INVENTION

This invention relates to power line sensors and methods.

BACKGROUND OF THE INVENTION

Ungrounded power line sensors measure the voltage of a medium-voltage power line relative to ground through, for example, a capacitive coupling between metal plates on the outside of the sensor and ground. Under normal conditions, accurate voltage measurements are possible. However, the accumulation of snow and/or ice on the sensor can change the capacitive coupling between the sensor and ground, resulting in errors in the measurement of line voltage.

Snow and ice effects are thus a problem with this type of capacitive voltage sensor. For example, U.S. Pat. No. 4,795,973 describes a modification of the system described in U.S. Pat. No. 4,689,752 with the objective of being less sensitive to snow. U.S. Pat. No. 4,795,973 describes a configuration where the entire sensor body is turned into a single, large voltage sensing plate. All of these patents are incorporated herein by this reference. These approaches may still be somewhat sensitive to snow because significant snow build-up will change the effective surface area of the sensor, instead spuriously increasing the voltage rather than spuriously decreasing the measured voltage.

In the prior art, no known entirely successful mitigation technique has been found for voltage measurement error due to snow and/or ice accumulation for sensors without a neutral connection.

To be completely resistant to the effects of snow and ice, one typical solution is to use relatively large and heavy instrumentation transformers wired directly to each phase. A "Potential Transformer" (PT) is used to transform the line voltage down to a lower voltage that is more easily measured, typically about 120 Vrms. By measuring this lower voltage and multiplying by the turns ratio of the PT, the line-to-neutral voltage of a phase can be deduced. A "Current Transformer" (CT) is used to measure current. The line to be monitored passes once through a transformer core. A secondary with many turns is also wound around the transformer core, and the secondary is either shorted or drives a very small resistance. The secondary is isolated from the voltage on the primary, and the current on the secondary is much lower than (and proportional to) the current on the line, with the turns ratio of the transformer again being the proportionality constant. Voltage, current, power, etc., are then measured by a commercial meter attached to the PT and CT (for example, the ITRON Quantum Q 1000). Such a solution can be expensive and labor intensive to install.

BRIEF SUMMARY OF THE INVENTION

One purpose of the invention, in one example, is to make ungrounded power line voltage sensors immune to the effects of snow and ice build-up on the sensor.

The present invention preferably uses an alternate estimate of line voltage, available from the power supply voltage of the system's data collector, to identify when voltage degradation is occurring and to mitigate this degradation. In this way, the system can tolerate adverse weather conditions with little or no degradation in sensing performance.

The invention preferably applies to ungrounded power line sensors (a "Feeder Meter") that may capacitively measure the voltage of the line relative to the ground. These sensors also measure the current in the line, and scavenge power from the line to operate. From the combination of voltage and current, the sensors can also deduce real and reactive power flow and integrate real and reactive energy, volt*hours, and amp*hours.

One type of sensor is described in U.S. Pat. No. 6,677,743 incorporated herein by this reference. Another device is shown in the disclosure of U.S. Pat. No. 4,689,752 also incorporated herein by this reference.

The subject invention, however, in other embodiments, need not achieve all these objectives and the claims hereof should not be limited to structures or methods capable of achieving these objectives.

Featured is an alternate voltage sensing method for use with ungrounded power line sensors deployed on each phase of the power line. A collector is powered by a transformer connected to the power line being monitored. The collector includes a voltage measurement circuit configured to measure the collector supply voltage. The collector supply voltage is used to calculate an alternate voltage measurement for each phase. The primary voltage measurement obtained via the ungrounded sensors is typically calibrated at the time of sensor installation through a one-time direct phase-to-neutral voltage measurement. This phase-to-neutral voltage measurement is also used to calibrate the relationship between the collector supply voltage and the voltage of the medium voltage power lines monitored by the ungrounded power line sensors. The calibration factors for each phase are used to scale subsequent measurements of collector supply voltage resulting in an alternate voltage measurement for each phase.

When a sensor measured voltage for any phase deviates from the alternate voltage measurement by a pre-established value, one or more actions can be taken. In one example, the collector is configured to only detect when the sensor measured voltage for any phase deviates from the alternate voltage measurement. In another example, the collector is configured to both detect a voltage deviation and correct voltage related measurements using the ratio of the alternate voltage to the sensor measured voltage.

Preferably, the voltage measurement circuit converts the collector supply voltage to a low voltage which is then converted to a digital signal. The voltage measurement circuit may sample this digital signal to determine the collector supply voltage. Preferably, the voltage measurement circuit converts the collector supply voltage to a low voltage that is compatible with an analog-to-digital converter (ADC). A microcontroller with an integrated ADC may sample this conditioned voltage and to determine the collector supply voltage.

Obtaining an alternate voltage measurement for each phase may include scaling the measured collector supply voltage based on a collector calibration factor for each phase. The collector calibration factor for each phase may be determined by measuring the phase voltage of each phase of the power line during calibration of the ungrounded sensors.

Also featured is a power line voltage measurement system. Ungrounded sensors are deployed on each phase of the power line and a collector receives a sensor measured voltage of each phase. The collector is powered from a transformer connected to the power line being monitored. The collector is configured to measure the collector supply voltage. The collector is configured to use the measured collector supply voltage to calculate an alternate voltage measurement for each phase and to detect when the sensor measured voltage for any phase deviates from the alternate voltage measurement by a predetermined threshold.

The preferred collector is further configured to correct voltage related measurements using the ratio of the alternate voltage measurement to the sensor measured voltage and/or to log times when the sensor measured voltage for any phase deviates from the alternate voltage measurement by the predetermined threshold.

Also featured is a power line measurement collector device comprising a voltage measurement circuit configured to measure a power line supply voltage powering the collector and a receiver for receiving phase voltage signals from ungrounded sensors disposed on the phases of the power line. The collector software derives a calibration factor between the supply voltage and the phase voltage for each phase using a one-time phase to neutral voltage measurement. The calibration factor for each phase is stored and the collector calculates an alternative voltage for each phase based on the stored calibration factors. The collector monitors the received phase voltage signals from the line-mounted sensors for a predetermined deviation from the alternative voltages.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
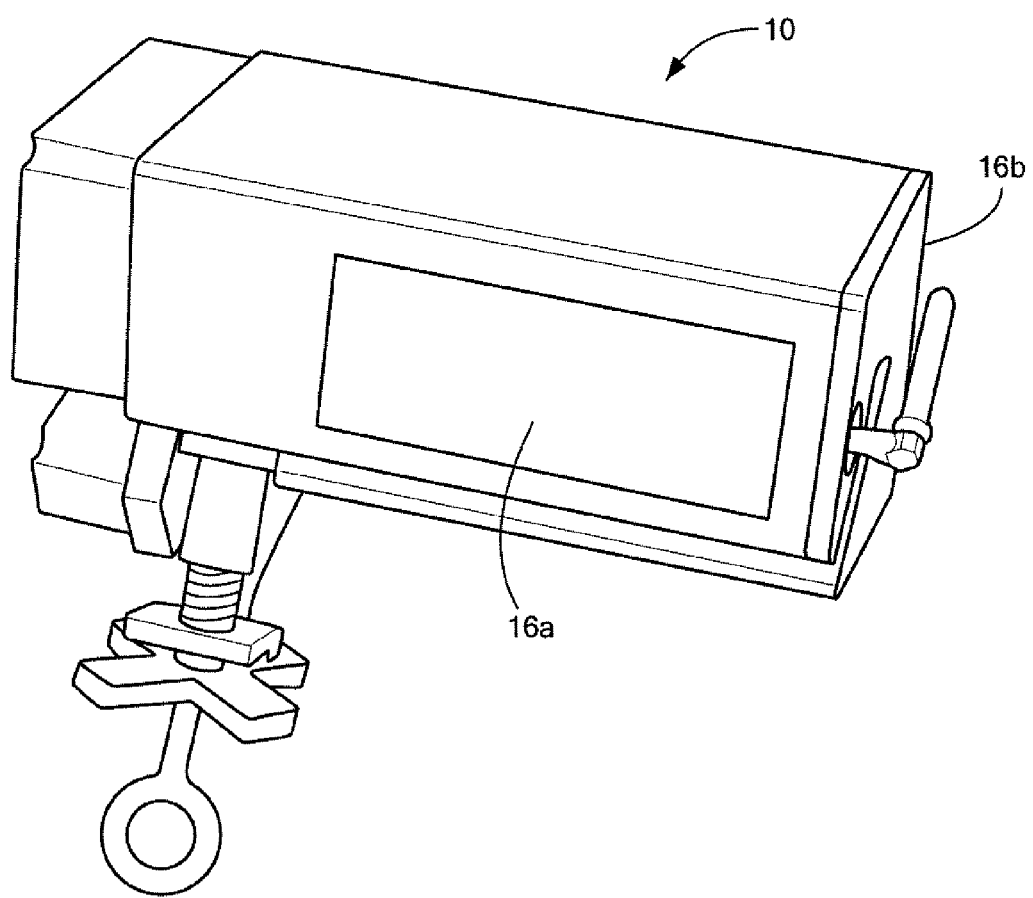
FIG. 1 is a front three dimensional schematic view of an example of an ungrounded sensor.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
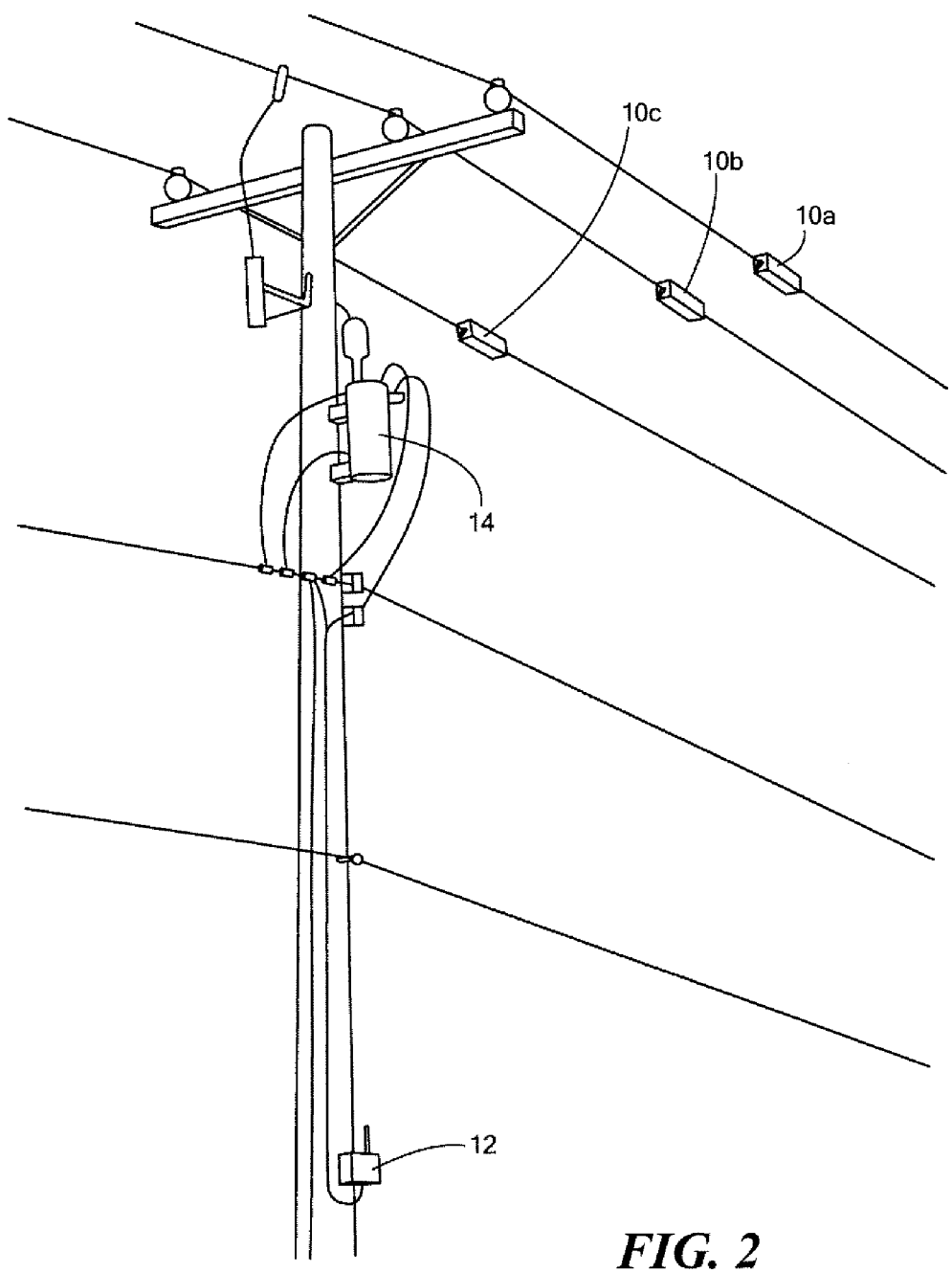
FIG. 2 is a view showing three sensors deployed on a power line.

One version of a suitable power line sensor is pictured in FIG. 1. Under normal conditions, the sensor 10 can measure voltage accurately to +/−0.5%, so long as the sensor is calibrated in place after installation. A typical installation is shown in FIG. 2. Three sensors 10a, 10b, and 10c can be seen mounted on a medium voltage three-phase power distribution feeder, one sensor on each phase of the feeder. The sensors communicate via radio to a collector 12, located on a nearby utility pole. Also visible in FIG. 2 is a single-phase transformer 14 here attached between Phase "B" of the feeder and the neutral line. The transformer supplies the 120V power needed to power collector 12.

Figure 3:
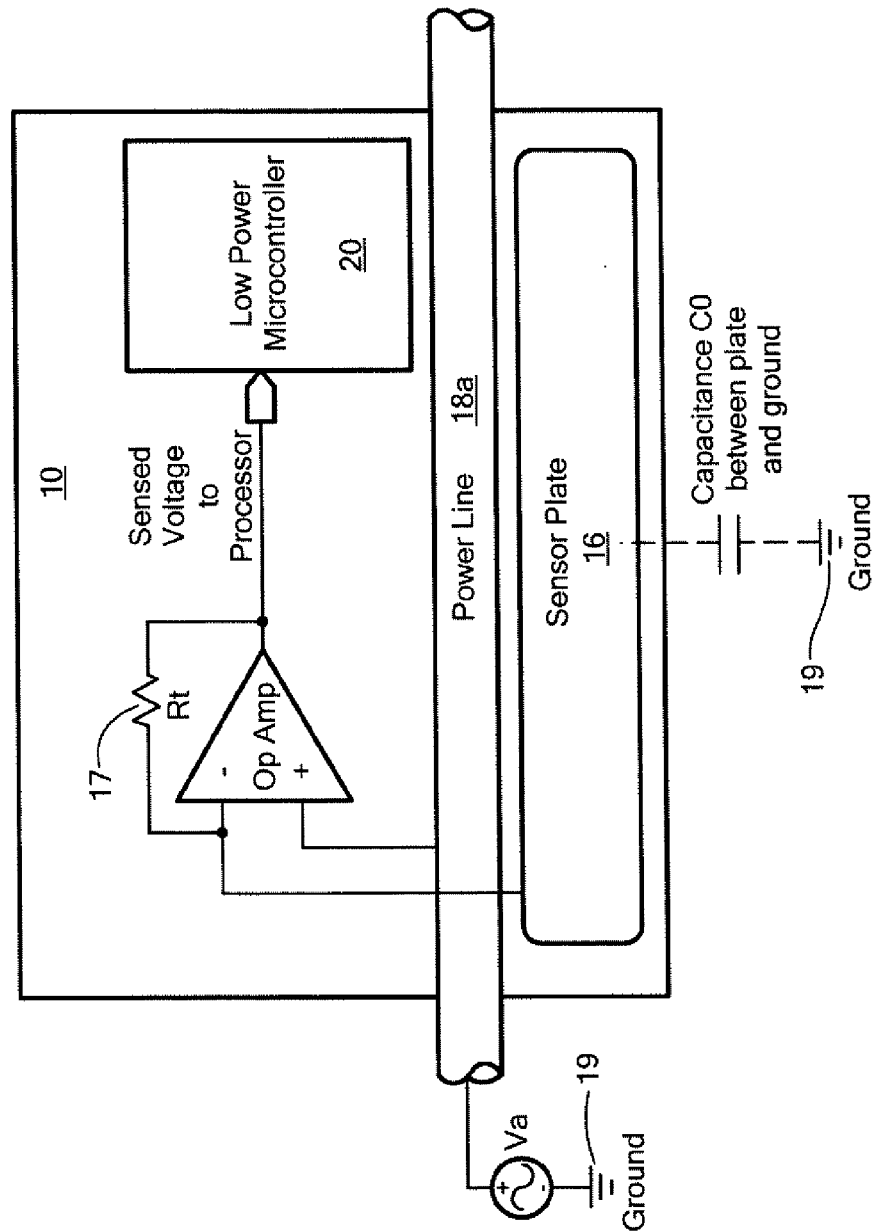
FIG. 3 is a schematic diagram of an example of a voltage measurement circuit for a sensor.

Each sensor measures voltage with a circuit schematically shown in one example in FIG. 3. There is a capacitive impedance between the voltage sensor plates 16a, 16b on the bottom of the sensor body and ground, represented in FIG. 3 by capacitance C0 17. The value of capacitance C0 is typically on the order of $10^{-12}$ Farads. The circuit in FIG. 3 measures the very small current that flows back and forth from the power line 18 to the surface of the plate 16 due to this capacitance. This current is a measure of the voltage between the power line and ground. The sensed voltage is presented as an input to microcontroller 20 which then processes the voltage signal and reports it, via an rf communication link, to data collector 12, FIG. 2. Other voltage sensor devices and circuits are possible.

Figure 4:
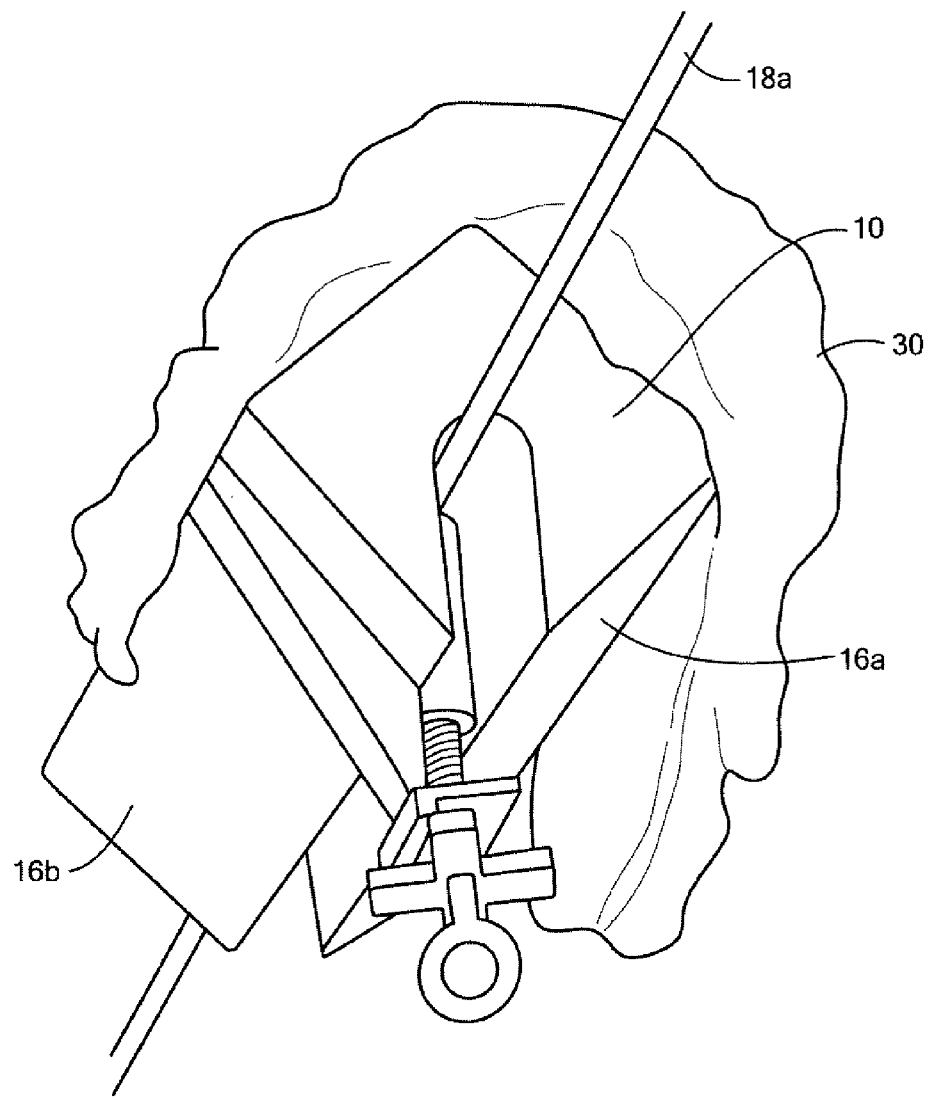
FIG. 4 is a view showing a sensor with accumulated snow thereon.

Although such a sensor usually provides highly accurate readings of voltage, certain weather conditions can degrade voltage accuracy. Specifically, snow can accumulate on the sensor. A particular case of snow accumulation is shown at 30 in FIG. 4. As shown, the snow has partially slid from the sensor, covering the plate 16a on one side of the sensor 10. This configuration of snow reduces the capacitance C0 between sensor and ground and appears to the sensing circuit 17, FIG. 3 as a drop in the sensed voltage.

Figure 5:
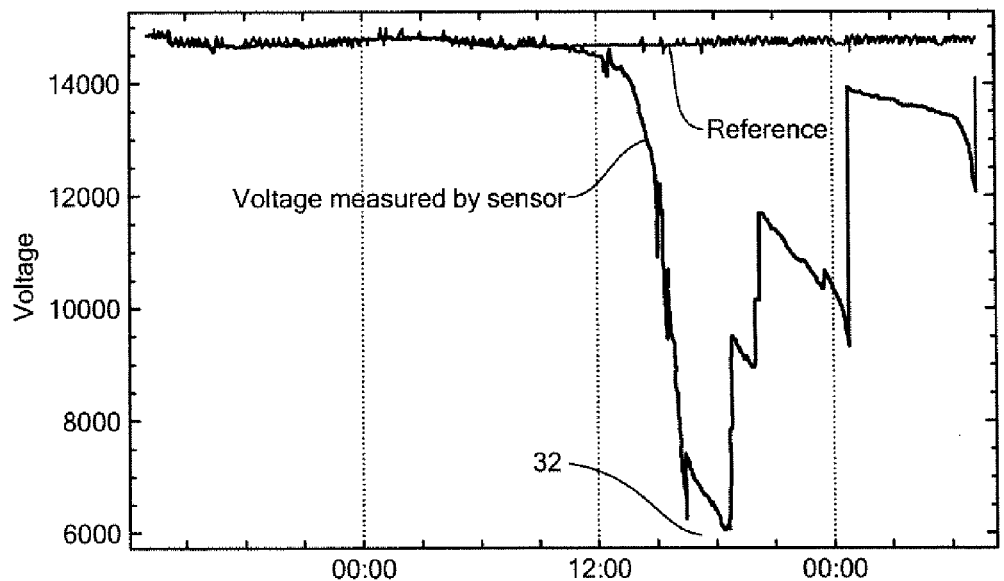
FIG. 5 is a chart showing voltage measurements over time and the effect of a weather event degradation.

During this sort of snow event, the voltage measured by the sensor appears as is shown in FIG. 5. The measured voltage droops as shown at 32 as snow builds up on the sensor and slides to cover one side of the sensor. As pieces of snow break off, the sensor recovers part of the voltage in a short time, but becomes further affected as more snow slides in front of the plate. Eventually, all snow slides off of the sensor, and the sensor resumes its normal function.

Figure 6:
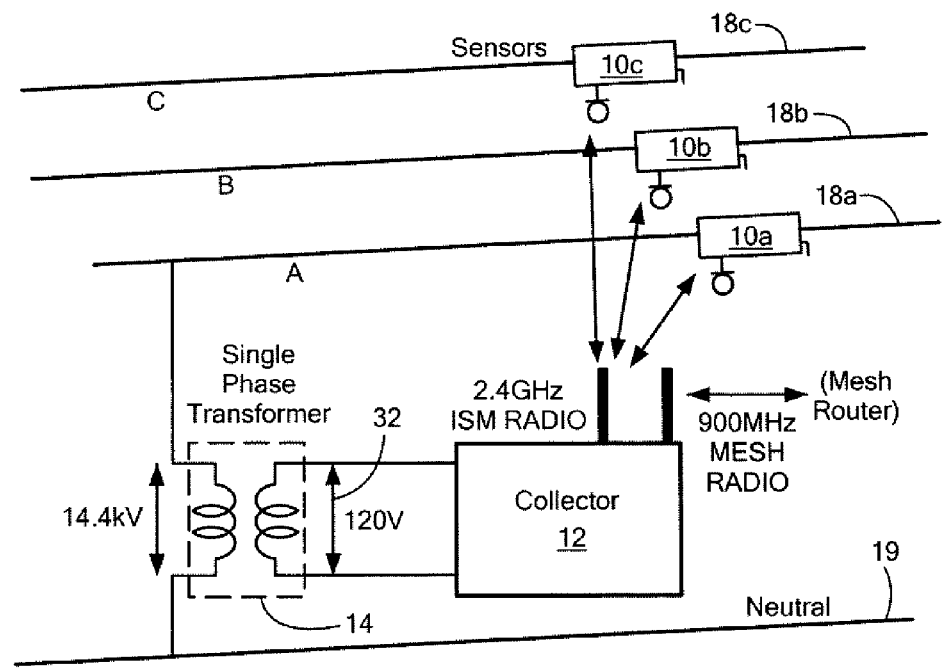
FIG. 6 is a schematic view showing the primary components of a system in accordance with the invention.

The proposed invention, in one example, uses a measurement of the data collector supply voltage as an alternate voltage measurement that can be used to identify the presence of voltage errors due to snow and ice and/or to correct errors due to snow and ice. In the invention collector 12, FIG. 6 is preferably powered from transformer 14 preferably connected to ground 19 and one phase 18a of the feeder being monitored by a feeder meter sensor 10a. The single-phase transformer 18a used to power collector 12 reduces the medium voltage of the distribution line to a tractable voltage near 120 Vrms. The supply voltage to collector 12 is related to the feeder 18a voltage by the transformer 14 ratio of the transformer supplying the collector.

Figure 7:
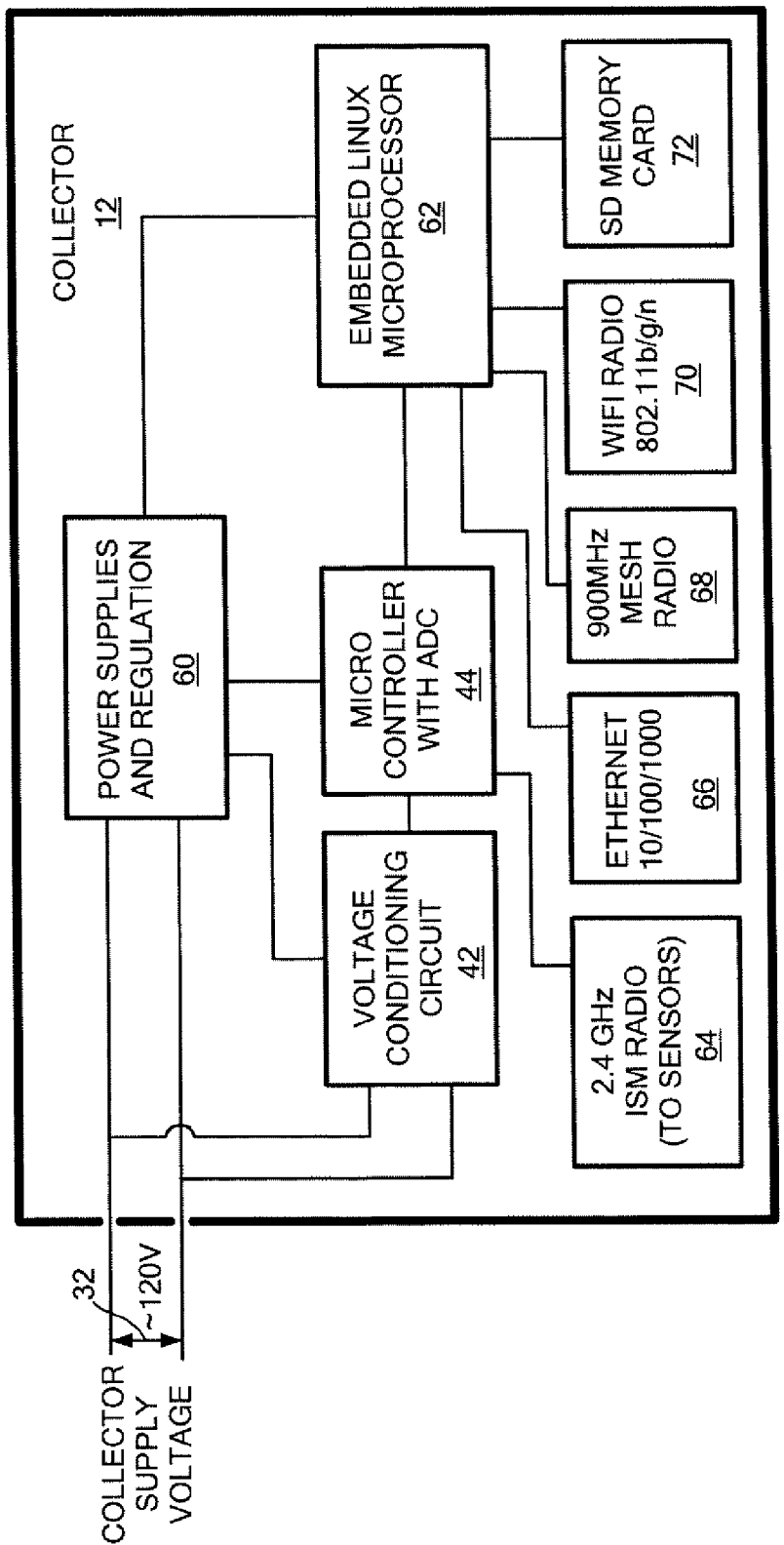
FIG. 7 is a block diagram of the collector of FIG. 6 with a voltage measurement circuitry.

The proposed invention adds extra circuitry and functionality to collector 12 to measure the collector's supply voltage. To add this capability, an additional voltage measurement circuit is added to the collector. The block diagram of one exemplary collector is shown in FIG. 7. The collector supply voltage 32 is fed into a voltage conditioning circuit 42. This circuit preferably including a voltage divider and an op amp buffer reduces the voltage from the ~120V supply voltage to a low voltage in the range of a few volts for measurement with an Analog-to-Digital Converter (ADC). In the initial reduction to practice, a circuit based on the LTC 1992 differential Op Amp was employed.

The signal output by the circuit 42 is then repeatedly measured by an ADC built into microcontroller chip 44 of the collector. In the one prototype device, a TI MSP-430 class microcontroller samples an associated 16-bit ADC at a rate of 2048 Hz. A True RMS-type filter (in the prototype implementation, taking the RMS by squaring the sensed signal, applying a low-pass, and taking the square-root of the result) is then applied in software operated on the microcontroller 44. The result of this measurement procedure is a measurement of the collector supply voltage which is unaffected by a snow event.

The microcontroller 44 also communicates with the sensors 10, FIG. 2 via a 2.4 GHz Industrial, Scientific, and Medical (ISM) band radio module 64, FIG. 7 obtaining measurements of voltage, current, power, and energy from the sensors. The microcontroller 44 passes both sensor and the collector supply voltage measurement to microprocessor 62 running embedded Linux. Software on the microprocessor 62 applies scaling factors determined during calibration to the phase voltage measurement from the sensors. Collector calibration factors, also determined during calibration, are applied to the collector supply voltage measurement to produce an alternative voltage for each phase. The software then compares the alternative and phase voltages to determine if there is a snow condition and logs and/or corrects various measurements for the snow condition. The microprocessor 62 may use a Secure Digital (SD) Memory Card 72 to locally store the collected data may use an Ethernet module 66, a 900 MHz mesh radio 68, or a WiFi Radio 70 to transmit the collected data to end consumers of the data (e.g. SCADA systems). The voltage measurement circuit configured to measure the collector's supply voltage, however, could be implemented in other ways. Only one preferred embodiment includes voltage conditioning circuit 42, microcontroller 44, and microprocessor 62.

The exact scaling relationship between the supply voltage measurement produced in the collector and the corresponding phase-to-neutral voltage (phase voltage) of the power line 18a, FIG. 6 as measured by a sensor 10a, 10b, 10c is not necessarily known a priori.

Figure 8:
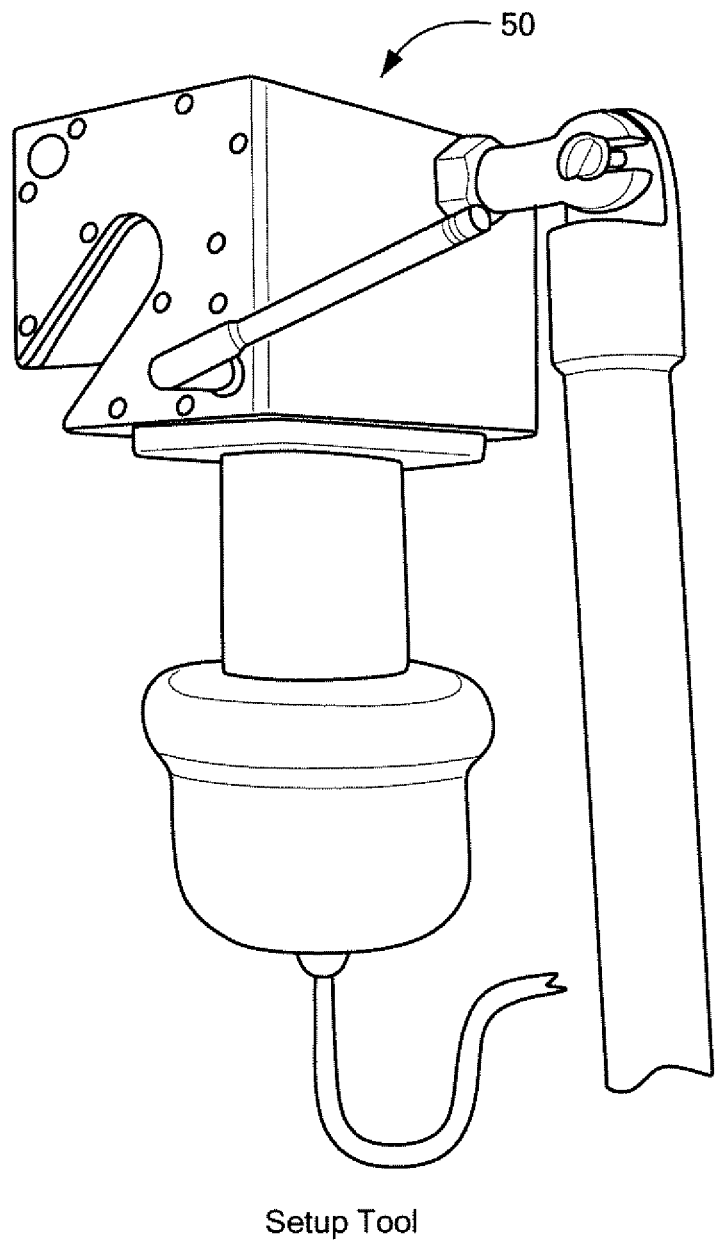
FIG. 8 is a view of one example of a calibration tool.
Figure 9:
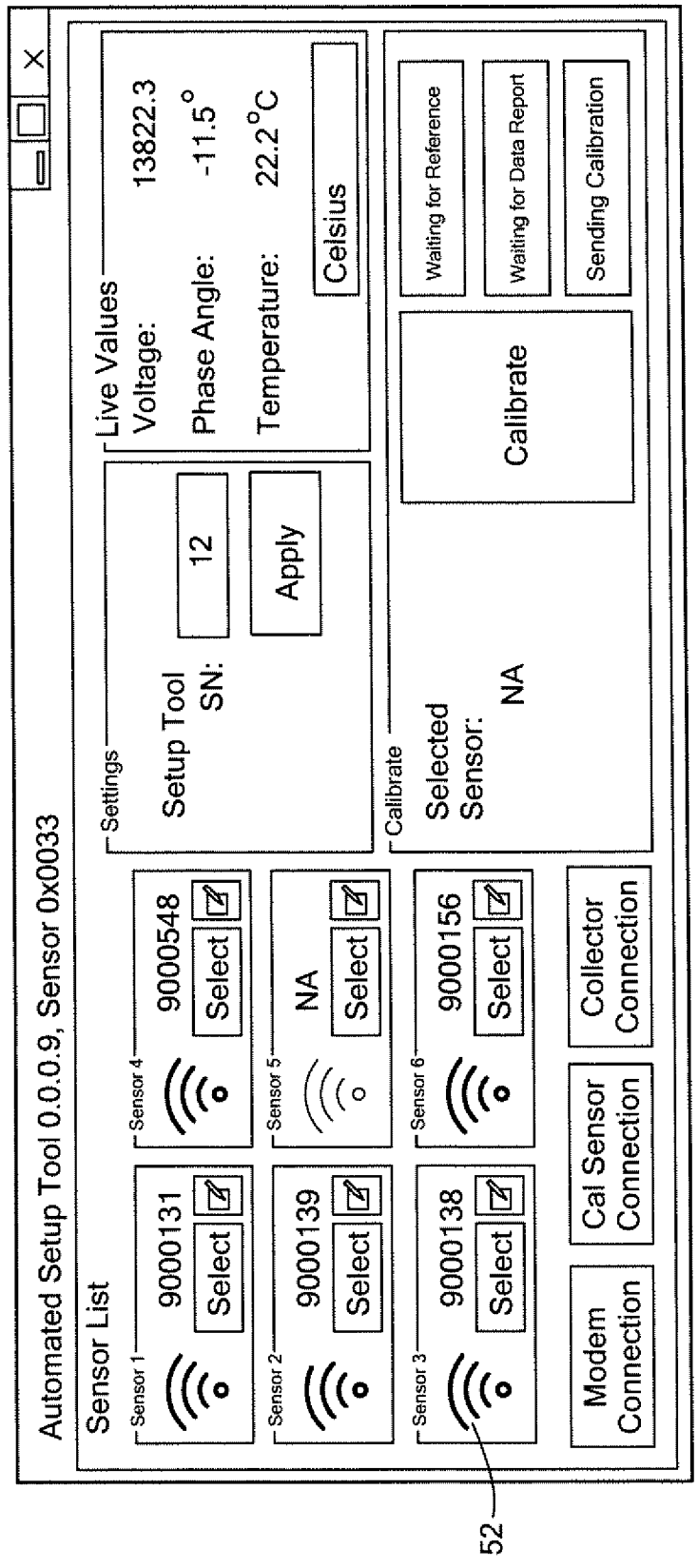
FIG. 9 is a view of an application for the set-up tool of FIG. 8 operable, for example on a tablet PC.
Figure 10:
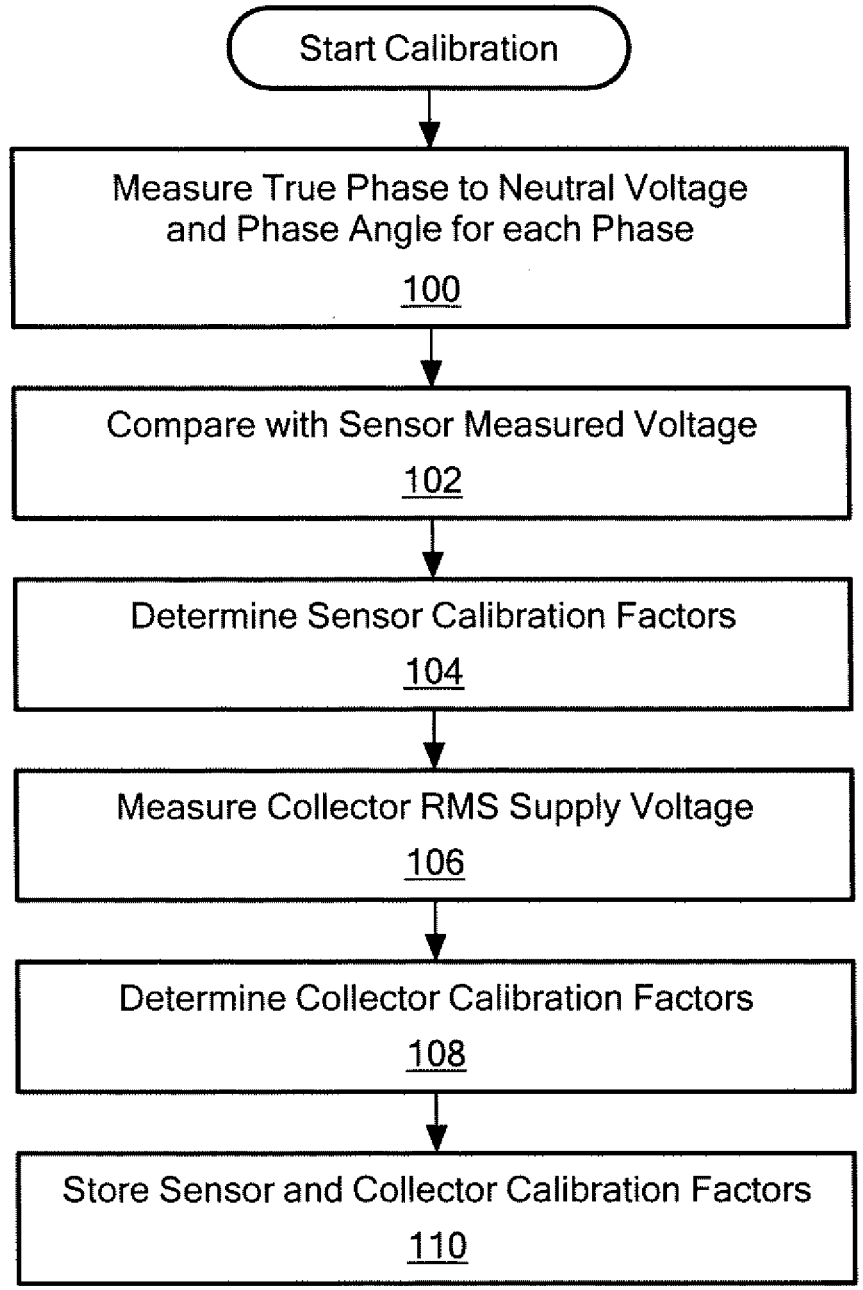
FIG. 10 is a flow chart depicting the primary steps associated with a calibration algorithm in accordance with one version of the invention.

However, one step in the installation of the line-mounted sensor is the in situ calibration of the phase voltage measured by the line-mounted sensors (e.g., sensor 10a, FIG. 6). That process is modified here to scale the supply voltage to produce an alternative voltage measurement specific to each phase as part of the sensor calibration process. Specifically, a hot stick-mounted setup tool 50, FIG. 8 is used in this example to precisely measure the true phase-to-neutral voltage and phase angle of each of the three phases, step 100, FIG. 10. An "automated setup tool" application 52, FIG. 9 running on a nearby tablet PC (not shown) communicates by radio to both the collector and setup tool 50 to synchronize collector and setup tool measurements with sub-second accuracy. One setup tool system is disclosed in application Ser. No. 14/061,128 filed Oct. 23, 2013 which is incorporated herein by this reference. By comparing, step 102, FIG. 10, a phase voltage measurement from the sensor with a time-synchronized phase-to-neutral voltage measurement by the setup tool, a calibration coefficient for the each sensor's phase voltage is obtained, step 104. The sensor calibration coefficients are stored in the collector and/or in each sensor.

Thereafter, in use, the supply voltage derived from the collector supply voltage is sampled synchronously with the line voltage, and the same setup tool measurement is used automatically by the setup tool software to scale the supply voltage measurement to the phase-to-neutral voltages measured by the setup tool on each phase yielding an alternative voltage measurement for each phase. During calibration, each sensor's measured calibration voltage is Vcal_a, Vcal_b, Vcal_c. Then each sensor reports a signal corresponding to a measured voltage Vma, Vmb, Vmc. Sensor calibration factors fa, fb and fc are based on the differences between Vcal and Vm and are stored for each sensor (on board the sensor and/or in the collector). Collector calibration factors for each phase ga, gb, and gc are as follows where Vcs is the collector RMS supply voltage as shown at step 106:

$$ga = \frac{Vcal\_a}{Vcs},\tag{1}$$

$$gb = \frac{Vcal\_b}{Vcs}, \text{ and}\tag{2}$$

$$gc = \frac{Vcal\_c}{Vcs},\tag{3}$$

Figure 11:
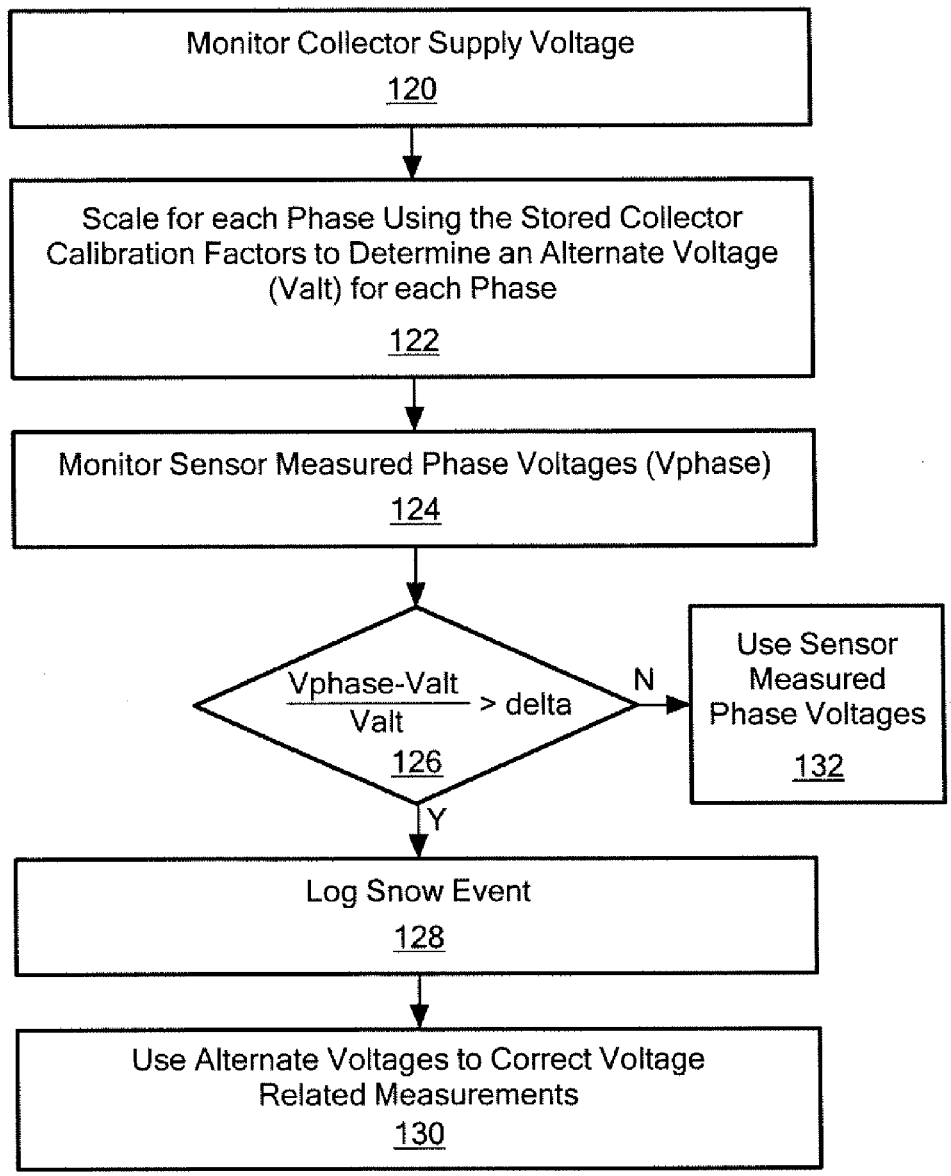
FIG. 11 is a flow chart depicting the primary steps associated with an algorithm for detecting a snow event in accordance with aspects of the invention.

See step 108. These collector calibration factors are stored in the collector, step 110, The alternate voltage for each phase is thus a scaled version of the measured collector supply voltage, step 120, FIG. 11:

$$Valt\_a = ga*Vcs,\tag{4}$$

$$Valt\_b = gb*Vcs, \text{ and}\tag{5}$$

$$Valt\_c = gc*Vcs\tag{6}$$

See step 122. A microprocessor or controller, application specific integrated circuit, field programmable gate array, or similar computation device on board or in communication with the collector is programmed to carry out these calculations. See microcontroller 44, FIG. 7.

Although there is only one supply voltage measurement from the collector sensing circuitry that is directly associated with to just one of the three phases being monitored, the supply voltage can be fairly accurately used as a source for an alternative voltage measurement for all three phases. International standards (e.g. EN-50160 or the IEC 1000-3-x series), for example, limit unbalance between the phases of a distribution line to less than 2% (see, for example, http://tinyurl.com/nffewr8) so that the measurement of any one phase voltage is a proxy for the voltage of the other phases with an accuracy typically better than 2%.

Once an alternative voltage measurement is obtained, the alternative voltage can be used to identify degraded voltage measurement conditions (e.g. accumulations of snow and ice). For ease of nomenclature, let the phase voltage measured by a sensor on a given phase, corrected using the sensor calibration factors, be represented as Vphase, and let the associated alternative voltage measurement during calibration and derived from the collector supply voltage be denoted as Valt. Degraded voltage measurement conditions can then be derived by monitoring Vphase, step 124, and determining if significant deviations between the phase voltage and alternative voltage measurements. For example, the following pseudo code can be employed in controller 44, FIG. 7 (or some other controller or processor of the collector) to identify a degraded condition:

```
if (abs(Vphase-Valt)/Valt > delta), bSnow = TRUE;
else bSnow = FALSE;
``` where bSnow is a Boolean variable indicating the presence of a degraded voltage sensing condition when TRUE, or normal voltage sensing conditions when FALSE. Parameter delta determines how big an error is required before a degraded condition is indicated, typically a relatively small tolerance approximately 2%. See Step 126.

For some applications, a simple demarcation of degraded conditions may be sufficient, step 128. For those cases, it is sufficient to simply log the bSnow variable as an indicator of data validity associated with a particular sampling instance.

However, for other applications, a "corrected" version of voltage-related measurements is desired, step 130. Specific instantaneous values from the sensor are phase voltage (V), Real Power (P), and Reactive Power (Q). The sensors also accumulate some values over the time interval between sensor reads. These values include interval Volt*Hours (dVh), interval Real Energy (dW), and interval Reactive Energy (dR). These values can be corrected in the collector controller by multiplying by the ratio of alternative to phase voltages, in particular, using the formulas:

$$V=(V\text{alt}/V\text{phase})*V; \quad (7)$$

$$P=(V\text{alt}/V\text{phase})*P; \quad (8)$$

$$Q=(V\text{alt}/V\text{phase})*Q; \quad (9)$$

$$dVh=(V\text{alt}/V\text{phase})*dVh; \quad (10)$$

$$dW=(V\text{alt}/V\text{phase})*dW; \text{ and} \quad (11)$$

$$dR=(V\text{alt}/V\text{phase})*dR. \quad (12)$$

The interval values of real and reactive energy and Volt*Hours can then be added to collector registers that accumulate the total energy and Volt*Hours over time (Vh, W, and R).

It has also proven to be useful to integrate the bSnow flag over time via software operating on the collector controller. The integrated quantity is denoted as SnowHours. The SnowHours register is updated each time bSnow is evaluated, using the following rules:

$$\text{if } (b\text{Snow}(k)==\text{TRUE}), \text{SnowHours}+=(t(k)-t(k-1))/2 \quad (13)$$

$$\text{if } (b\text{Snow}(k-1)==\text{TRUE}), \text{SnowHours}+=(t(k)-t(k-1))/2 \quad (14)$$

where bSnow(k) and bSnow(k−1) represent the values of bSnow at the present and previous evaluations, respectively. Similarly, t(k) and t(k−1) represent the times of the present and previous evaluations of bSnow.

The utility of SnowHours is that time differences of SnowHours represent the amount of time during a given interval that was spent in snow conditions. This determination is particularly important for a number of data post-processing analytics that use quantities like energy over finite intervals, obtained by taking time differences of the energy registers.

Thus, the power supply voltage of the collector is sensed by the collector in addition to the phase-to-neutral voltages obtained by sensors mounted on each phase. Also, the collector supply voltage may be employed as an alternate voltage measurement of voltage on each phase of the monitored power line through the use of a calibration factor relating the supply voltage to the phase voltage. The relationship between the alternative voltage and phase voltage on each phase of a three-phase distribution power line may be calibrated in place so that no detailed information is needed a priori about the relationship between the collector supply voltage and the phase voltage of the line being monitored. The difference between the alternative voltage and the phase voltage measured by the line-mounted sensor can be used to determine when degraded voltage measurement conditions occur (such as accumulation of snow and/or ice on the sensor). The collector preferably maintains and logs a flag that indicates degraded voltage measurement conditions. The collector may also maintain and log the time integral of the degraded voltage integral flag so that the time spent in degraded conditions for any particular time interval can be easily determined. Voltage-related measurements such as phase voltage, Volt*Hours, Real Power, Reactive Power, Real Energy and Reactive Energy can also be corrected in the collector during times when degraded voltage measurement is indicated (e.g. during times of snow and ice accumulation) using the ratio of Alternative Voltage to measured phase voltage.

The alternative voltage may not be as accurate as $V_{phase}$ when no snow is present and the alternate voltage relates to one phase only. But, during snow events when $V_{phase}$ degrades, the alternate voltage can be used as described above. Outside of snow events, sensor measured phase voltages are used, Step 132, FIG. 11.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An alternate voltage sensing method for use with ungrounded power line sensors, the method comprising:
    deploying an ungrounded sensor on each phase of a power line;
    measuring the voltage of each phase using said sensors;
    transmitting the measured voltage of each phase to a collector;
    powering the collector from a transformer connected to the power line being monitored;
    adding a voltage measurement circuit to the collector to measure the collector supply voltage;
    obtaining an alternate voltage measurement for each phase using the collector supply voltage; and
    detecting when the sensor measured voltage for any phase deviates from the alternate voltage measurement by a pre-established value.

2. The method of claim 1 further including correcting voltage related measurements using the ratio of the alternate voltage to the sensor measured voltage.

3. The method of claim 1 further including logging times when the sensor measured voltage for any phase deviates from the alternate voltage measurement.

4. The method of claim 1 in which the voltage measurement circuit converts the collector supply voltage to a low voltage which is then converted to a digital signal.

5. The method of claim 4 in which the voltage measurement circuit samples the digital signal.

6. The method of claim 1 in which obtaining an alternate voltage measurement for each phase includes scaling the measured collector supply voltage based on a collector calibration factor for each phase.

7. The method of claim 6 in which the calibration factor for each phase is determined by measuring the phase voltage of each phase of the power line during calibration of the ungrounded sensors.

8. A power line voltage measurement system comprising:
    ungrounded sensors to be deployed on each phase of the power line;
    a collector receiving a sensor measured voltage of each phase, the collector powered from a transformer connected to the power line being monitored and including a voltage measurement circuit configured to measure the collector supply voltage; and
    the collector configured to:
        use the measured collector supply voltage to calculate an alternate voltage measurement for each phase, and
        detect when the sensor measured voltage for any phase deviates from the alternate voltage measurement by a threshold.

9. The system of claim 8 in which the collector is further configured to correct voltage related measurements using the ratio of the alternate voltage measurement to the sensor measured voltage.

10. The system of claim 8 in which the collector is further configured to log times when the sensor measured voltage for any phase deviates from the alternate voltage measurement by said threshold.

11. The system of claim 8 in which the collector is configured to calculate an alternate voltage measurement for each phase by scaling the measured collector supply voltage for each phase based on a stored collector calibration factor for each phase.

12. A power line measurement collector device comprising:
    a voltage measurement circuit configured to measure a power line supply voltage powering the collector,
    a receiver for receiving phase voltage signals from ungrounded sensors disposed on the phases of the power line;
    a stored collector calibration factor for each phase; and
    a processor configured to:
        calculate an alternative voltage for each phase based on the power line supply voltage and the calibration factors; and
        monitor the received phase voltage signals for deviation from the alternative voltages.

13. The device of claim 12 in which the processor is further configured to correct voltage related measurements using the ratio of the alternate voltage to a sensor measured phase voltage.

14. The device of claim 12 in which the processor is further configured to log times when the sensor measured phase voltage for any phase deviates from the alternate voltage measurement by a predetermined threshold.

* * * * *